United States Patent [19]

Snyder et al.

[11] Patent Number: 5,021,401

[45] Date of Patent: Jun. 4, 1991

[54] INTEGRATED PRODUCTION OF SUPERCONDUCTOR INSULATION FOR CHEMICAL VAPOR DEPOSITION OF NICKEL CARBONYL

[75] Inventors: Thomas S. Snyder, Oakmont; Richard A. Stoltz; George R. Wagner, both of Murrysville, all of Pa.

[73] Assignee: Westinghouse Electric Corp., Pittsburgh, Pa.

[21] Appl. No.: 331,768

[22] Filed: Apr. 3, 1989

[51] Int. Cl.$^5$ .................. C23C 8/12; C23C 8/80; C23C 16/16

[52] U.S. Cl. ..................... 505/1; 505/730; 505/740; 505/819; 505/821; 148/277; 427/62

[58] Field of Search .............. 427/62, 117, 118, 120, 427/126.6; 505/701–704, 730, 740, 819, 821; 423/416; 148/277

[56] References Cited

U.S. PATENT DOCUMENTS

| | | | |
|---|---|---|---|
| 3,408,235 | 10/1968 | Berghout | 29/599 |
| 3,618,205 | 4/1968 | Barber | 29/599 |
| 3,872,359 | 3/1975 | Feuersanger | 354/4 |
| 4,053,976 | 10/1977 | Scanlan | 29/599 |
| 4,097,624 | 6/1978 | Schladitz | 427/251 |
| 4,261,097 | 4/1981 | Weisse | 29/605 |
| 4,330,347 | 5/1982 | Hirayama | 148/31.5 |
| 4,411,959 | 10/1983 | Braginski | 428/558 |
| 4,419,125 | 12/1983 | Charles | 29/599 |
| 4,575,927 | 3/1986 | Braginski | 29/599 |
| 4,673,430 | 6/1987 | Pfeil | 75/251 |
| 4,687,883 | 8/1987 | Flukiger | 174/126.5 |
| 4,759,950 | 7/1988 | Stevens | 427/55 |

FOREIGN PATENT DOCUMENTS

WO80/02619 11/1980 PCT Int'l Appl. .

OTHER PUBLICATIONS

High Temperature Superconductor; Tachikawa, pp. 727–730; 12-4-88.

Kirk Othmer Encyclopedia of Chemical Technology, vol. 4, pp. 749–813.

J. Chem. Soc., pp. 100–104, 1955, Spice et al., "The Heat Capacity of Nickel Carbonyl and the Thermodynamics of its Formation from Nickel and Carbon Monoxide".

J. Chem. Soc., pp. 2528–2529, 1955, Sykes et al., "Heat of Formation of Nickel Carbonyl".

Primary Examiner—Jay H. Woo
Assistant Examiner—Jeremiah F. Durkin, II
Attorney, Agent, or Firm—R. A. Stoltz; 10

[57] ABSTRACT

This is a process for fabrication of nickel-oxide insulation on a superconductor. The process utilizes; reacting oxygen-free nickel powder with oxygen-free carbon monoxide generally at 50°–75° C. to produce a nickel carbonyl, separating the nickel carbonyl from reaction by-products and excess reagents by cooling the carbonyl and decanting the nickel carbonyl liquor, and contacting the carbonyl to a surface of a wire containing superconductor or superconductor precursors in an atmosphere containing a controlled amount of oxygen, with the wire at 50°–800° C. to produce nickel suboxide insulation on the wire. The purified nickel carbonyl and oxygen may be alternately (rather than simultaneously) introduced, to deposit a series of metallic nickel films on the wire, each of which metallic films are then oxidized to a nickel suboxide. The superconductor may be a niobium-tin superconductor, and the carbonyl contacted to wire containing unreacted niobium and tin at a wire temperature between 50°–500° C. to coat the wire with the nickel suboxide, and final forming of the wire done after the coating of wire and the niobium and the tin are reaction annealed after the final forming of the wire. Alternately, a wire containing unreacted niobium and tin may be formed into final form, the purified carbonyl contacted to the wire at a temperature of 500°–750° C. and the niobium and the tin are reaction annealed, thus the insulation and the reaction annealing can be done essentially at the same time. The superconductor may also be an oxide ceramic superconductor.

8 Claims, 1 Drawing Sheet

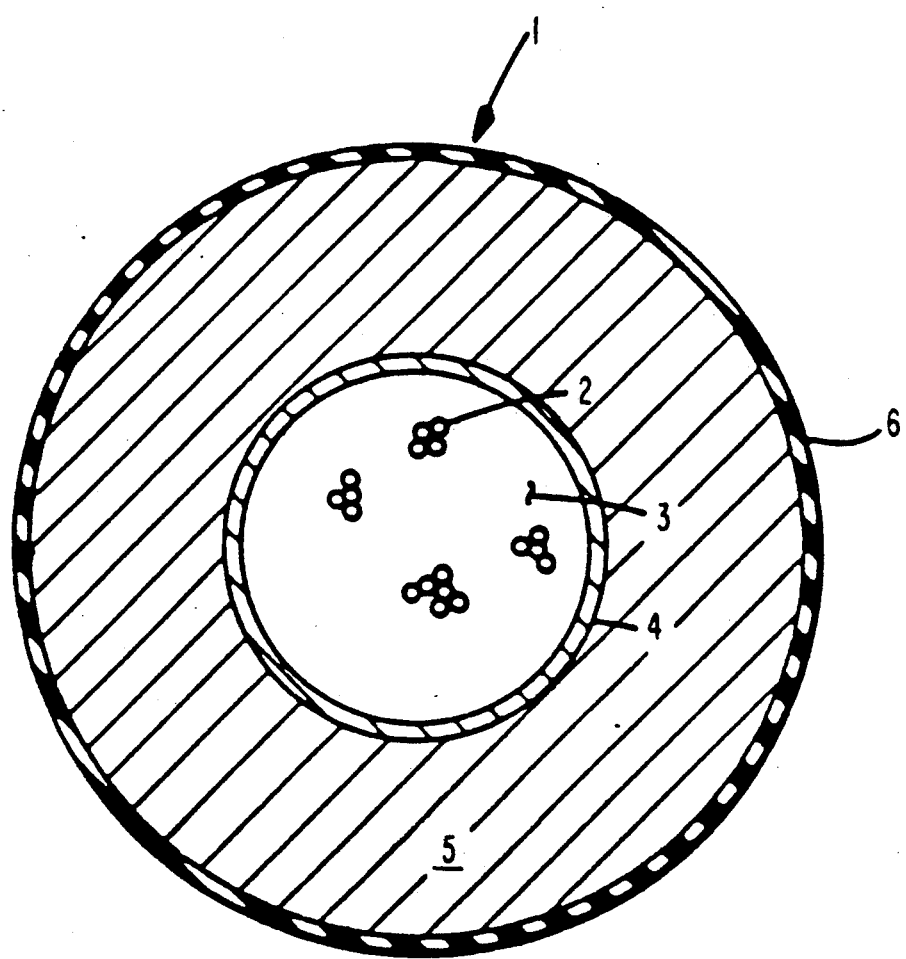

INTEGRATED PRODUCTION OF SUPERCONDUCTOR INSULATION FOR CHEMICAL VAPOR DEPOSITION OF NICKEL CARBONYL

A superconductor having a generally substoichiometric oxygen, nickel oxide insulation between superconductor strands is described in related application Ser. No. 212,842, filed June 29, 1988, and assigned the same assignee. The superconductor has an operating temperature below 250° Kelvin, and has at least two strands, each containing a superconductor, with a cladding consisting essentially of nickel disposed about at least one of the strands, and an adherent coating of nickel oxide formed on the outer surface of the cladding, the nickel oxide having stoichiometric or less than stoichiometric oxygen, but not greater than stoichiometric oxygen to be electrically insulating at the operating temperature of the superconductor, whereby high thermal conductivity strand insulation capable of withstanding strand to strand voltages of greater than 50 volts is provided to substantially eliminate coupling currents between the strands, and whereby nickel oxide having areas thereof semiconducting due to containing more than stoichiometric oxygen is avoided.

A process for use in fabrication of nickel-oxide insulation on a superconductor is described in copending application Ser. No. 301,409, filed Jan. 25, 1989. That process utilizes: contacting a nickel alkoxide gel to a surface of a wire containing superconductor or superconductor precursors; setting the gel at a temperature of less than 500° C.; and oxidizing the set gel in an oxidizing atmosphere at a temperature of 250°-1000° C. to produce nickel oxide insulation on the wire. The superconductor may be a niobium-tin superconductor, and the alkoxide gel contacted to the surface of a wire containing unreacted niobium and tin, and final forming of the wire done after the setting of the gel, and the niobium and the tin reaction annealed after the final forming of the wire.

A method for preparing a superconductor integrated circuit is described in U.S. Pat. No. 4,904,341. That invention is an improved method for providing silicon dioxide with openings which expose contact pad areas for connections to superconductor in the preparation of superconducting integrated circuits. The improvement utilizes an etchant gas consisting essentially of 50-95 volume percent nitrogen trifluoride and 5-50 volume percent rare gas (preferably about 77 volume percent nitrogen trifluoride, with argon or neon or mixtures thereof as the rare gas) for the reactive ion etching of the exposed portions of the silicon dioxide film, and thus a carbon-containing etchant is not used and polymer by-products of the etching process are essentially completely avoided.

An improved method of depositing an oxide superconductor on a substrate is described in related application Ser. No. 257,918, filed Oct. 14, 1988, and assigned to the same assignee now abandoned. That related application utilizes epitaxially growing a 0.05-2.0 micron thick, single crystal buffer layer of magnesia or cubic zirconia on a single crystal sapphire substrate; and then growing an oriented oxide superconductor layer on the buffer layer. The sapphire substrate with a thin buffer layer provides for low dielectric losses (negligibly larger than sapphire by itself), the oxide superconductor can be oriented in a desired direction to provide higher current carrying capacity, and reaction between the sapphire substrate and the oxide superconductor (especially that due to diffusion of aluminum) is minimized.

Copending application Ser. No. 121,013, filed Nov. 16, 1987, now abandoned, teaches the suspension of single-crystal grains of superconductive oxide in an alkoxide gel, where the alkoxide gel contains non-oxygen constituents of the superconductor, aligning the single crystal grains of oxide superconductor, and curing the gel in an oxidizing atmosphere to form an essentially single-crystal ceramic superconductor.

U.S. Pat. No. 4,900,536 teaches fluidized bed chlorination of a lanthanide ore, a separation of a chloride of the rare earth superconducting component from other rare earth chlorides, reacting the rare earth superconducting component chloride to produce the alkoxide and mixing with alkoxides of other non-oxygen constituents of the superconductor to produce an alkoxide composite for processing into a superconductor.

Copending application Ser. No. 121,010, filed Nov. 16, 1987, now abandoned, teaches making single-crystal superconductive oxide from an alkoxide gel, where the alkoxide gel contains non-oxygen constituents of the superconductor, contacting the gel with a single crystal substrate, and curing the gel starting at the gel substrate interface to form an essentially single-crystal ceramic superconductor.

The preceding applications are all assigned to the same assignee and are all hereby incorporated by reference.

BACKGROUND OF THE INVENTION

1. Field of the Invention

This invention relates to insulated superconductors and in particular to production of a nickel oxide superconductor insulation.

2. Description of Related Art

The recent discovery by Muller and Bednorz of ceramic superconductors which are superconductive at relatively high temperatures (e.g. now 90° K. or above) has dramatically increased the interest in superconductivity and resulted in a large number of publications. In addition, interest continues in the previous metallic superconductors such as niobium-tin or niobium-titanium.

The ceramic superconductors have generally been oxides of at least one rare earth (hereafter the term "rare earth" will be understood to include yttrium as well as the lanthanide elements, unless otherwise stated), at least one alkaline earth metal, and copper, although recently barium (or thallium), calcium, strontium, copper, oxide superconductors have been developed. Typically, the superconductors have been prepared by milling a rare earth oxide with copper oxide and with an alkaline earth metal carbonate (e.g. yttrium oxide, copper oxide, and barium carbonate) and firing the mixture at 1000°-1100° C., (typically regrinding, refiring, etc. a number of times) and then annealing the ceramic in an oxygen atmosphere at 400°-900° C. for an extended period of time (e.g. 0.5-5 days).

Ceramic superconductors are very sensitive to oxygen content and the oxygen content is generally adjusted by the high temperature annealing.

Braginski et al., in U.S. Pat. Nos. 4,411,959 and 4,575,927 issued Oct. 25, 1983 and Mar. 18, 1986, respectively, teach a submicron particle superconductor arrangement in which brittle superconductive particles remain unsintered in the fabricated wire, thus give a ductile wire, even though the superconducting material is brittle. The small particles provide spacing between particles of much less than the Ginzburg-Landau coherence lengths to avoid any significant degradation to $T_c$. U.S. Pat. No. 4,419,125 to Charles et al. on Dec. 6, 1983 teaches using liquid alkali metal to co-reduce a mixture of solid halides to produce such submicron powders.

The Weisse U.S. Pat. No. 4,261,097, relates to a method for insulating superconductors in a magnet winding. The method includes the steps of: (a) winding intermediate conductor products along with insulators and binders; (b) treating insulators to remove binders; (c) annealing to form superconductors; and (d) completely removing binders (see claim 1). Insulating $Nb_3Sn$ superconducting magnet windings are disclosed; however, nickel oxide is not mentioned as an insulating material.

The Scanlan et al. U.S. Pat. No. 4,053,976, relates to a method of making a $Nb_3Sn$ wire. The method includes forming a niobium-copper composite wire which is niobium in the form of a filament in a copper matrix, coating the wire with tin, heating the coated wire, depositing a layer of nickel or copper onto the wire and diffusing the tin into the wire to form $Nb_3Sn$ wire.

The published PCT Application, WO80/02619, relates to a superconductor used as a coil for a magnet with a nickel oxide coating.

The Berghout et al. U.S. Pat. No. 3,408,235, and the Barber et al. U.S. Pat. No. 3,618,205 relate to $Nb_3Sn$ filaments containing an oxide film. These patents do not disclose the use of nickel oxide as an insulating material.

The Hirayama et al. U.S. Pat. No. 4,300,347, relates to a resistive or semiconducting coating for use on $Nb_3Sn$ current conductors or hyperconductors in cryogenic applications. The coating is composed of cuprous sulfide. The layer provides enough insulation to reduce eddy current losses between strands, but enough conductivity to allow current transfer from the superconductor to copper wires in the event that the superconductor normalizes.

The Flukiger et al. U.S. Pat. No. 4,687,883, relates to a method for producing $Nb_3Sn$ multifilament superconductive wires embedded in a copper or copper alloy matrix. Additive elements included in the matrix include Ti, Zr, Hf, V, Nb, Ta, Fe, Co and Ni. The patent does not disclose the use of nickel oxide as an insulating material.

The Feuersanger U.S. Pat. No. 3,872,359, relates to a thin film transistor utilizing a semiconducting layer formed of a defect-nickel oxide. Filamentary $Nb_3Sn$ wires with nickel oxide coatings are not disclosed.

Multifilamentary $Nb_3Sn$ superconductors usually consist of $Nb_3Sn$ filaments embedded in a bronze matrix surrounded by copper. Because $Nb_3Sn$ is a brittle, intermetallic compound, the conductor is usually processed to final form with Nb filaments in a copper or bronze matrix. The $Nb_3Sn$ is then formed by reaction of the filaments with the Sn in the bronze or from some other internal or external source. This reaction takes place at temperatures in the range 600°-750° C. A film insulation system suitable for use on these conductors has long been sought. Conventional organic insulations, such as Formvar or Omega, cannot withstand the reaction temperature and must be applied after the $Nb_3Sn$ is formed. The current carrying capacity of the superconductor is degraded by strain which may occur during the insulation process. Furthermore, subsequent winding into a magnet usually creates significant strain of the conductor and a corresponding degradation of its properties.

SUMMARY OF THE INVENTION

Although $Nb_3Sn$ superconductors are generally used in the examples and discussions herein, the oxide ceramic superconductors are also brittle, and generally need controlled atmosphere heating in final form (e.g. 500°-900° C. post-bake), and the invention herein is applicable to insulate such ceramic superconductors. Although various types of insulation can be relatively easily applied to niobium-titanium superconductors, this method can also be used with such superconductors.

This is a process for use in fabrication of nickel-oxide insulation on a superconductor. The process comprising; reacting essentially oxygen-free nickel powder with essentially oxygen-free carbon monoxide at a temperature of at least 50° (and preferably less than 75°) °C. to produce a nickel carbonyl, separating the nickel carbonyl from reaction by-products and excess reagents by cooling the carbonyl to 10°-43° C. and decanting the nickel carbonyl liquor to produce a purified carbonyl, and at least periodically contacting the purified carbonyl to a surface of a wire containing superconductor or superconductor precursors in an atmosphere at least periodically containing a controlled amount of oxygen, with the wire at a temperature of 50°-800° C. to produce nickel suboxide insulation on the wire. The purified nickel carbonyl and oxygen may be alternately introduced, to deposit a series of metallic nickel films on the wire (especially at higher temperatures such as 500°-750° C.), each of which metallic films are then oxidized to a nickel suboxide.

The superconductor may be a niobium-tin superconductor, and the carbonyl contacted to the surface of a wire containing unreacted niobium and tin (preferably at a wire temperature between 50°-500° C.) to coat the wire with the nickel suboxide, and final forming of the wire done after the coating of wire and the niobium and the tin are reaction annealed after the final forming of the wire. Alternately, a wire containing unreacted niobium and tin may be formed into final form, the purified carbonyl contacted to the wire at a temperature of 500°-750° C. and the niobium and the tin are reaction annealed while the nickel suboxide is being deposited, whereby thick coatings can be utilized (thick coatings may crack and spall, if wire with thick coating is formed after the coating is deposited) and the producing of the insulation and the reaction annealing can be done essentially at the same time in the same furnace.

The superconductor may also be an oxide ceramic superconductor in which case the contacting the purified carbonyl to a surface of the wire is preferably at 50-°650° C.

Preferably, the reacting essentially oxygen-free nickel powder with essentially oxygen-free carbon monoxide to produce a nickel carbonyl is at 60°-70° C., the separating the nickel carbonyl from reaction by-products and excess reagents is performed at 25°-40° C., and the wire is resistance heated during deposition to a temperature at least 50° C. higher than the atmosphere.

Preferably the nickel oxide has 0.7-0.99 stoichiometric oxygen, with each strand having the cladding, and each having the coating of nickel oxide, with the coatings having a thickness in the range of 1.5-20.0 microns.

BRIEF DESCRIPTION OF THE DRAWING

The single figure is a schematic cross-sectional view of a typical semiconductor strand for use in a standard cable for superconducting magnets.

DESCRIPTION OF THE PREFERRED EMBODIMENT

Superconducting applications, both wires and electronic components, require insulation materials which are: insulating at the superconductive transition temperature (Tc), even though they may conduct at higher temperatures, compatible with the fundamental superconducting materials whether superconducting metal alloys (e.g., NbSn or NbTi) or one of the ceramic oxides are used. Substoichiometric nickel oxides meet both insulation requirements but are extremely difficult to deposit using known technologies, e.g., depositing or extruding the nickel oxide from powder, paste, or slurry directly, and adjusting the stoichiometry.

The present invention produces nickel suboxide insulations based on a nickel carbonyl deposition. It integrates the nickel carbonyl production, the insulation deposition, and stoichiometry adjustment into a single process. The process can be arranged to allow: (i) tailoring the product purity; (ii) reducing carbonyl shipping and handling operations to minimize the toxic and explosive risks associated with carbonyl processing (see Table 1); (iii) controlling the product stoichiometry directly during deposition; (iv) the integration of carbonyl production and insulation deposition into single continuous operation; (v) depositing the nickel in a controlled oxidizing environment to obtain the proper substoichiometric composition.

The normal product of thermally-induced nickel carbonyl deposition is metallic nickel. By using an oxidizing atmosphere in the deposition chamber, a substoichiometric oxide film is obtained without any post deposition processing to adjust stoichiometry. This oxidizing deposition atmosphere will also destroy the toxic carbon monoxide by-product, by converting it to $CO_2$ for discharge.

To reduce further both the personnel and operating risks of nickel carbonyl processing, robotic and remote handling procedures and system designs may be used.

A typical superconductor wire strand used in a sheathed cable is illustrated in the single figure and comprises a large number of superconductor, e.g., $Nb_3Sn$, filaments 2 imbedded in a copper-rich matrix 3, e.g., bronze. The matrix 3 (core) is shown surrounded by a thin tantalum sheath 4 and outside the sheath 4 is a layer 5 of high-conductivity copper. Before the strand of the figure and others like it may be compacted into a stainless steel jacket to form the stranded cable, each of the individual strands must have an electrically resistive layer on its surface to reduce the coupling of currents between strands in the finally assembled cable.

As noted in the aforementioned Ser. No. 212,842, a film of generally substoichiometric oxygen, nickel oxide (NiO) 6 applied to the outer surface of each strand is an ideal outer layer for the strand. Since the nickel oxide is preferably not stoichiometric, a more proper designation would be $NiO_{1-x}$, where X 0.3; however, for convenience hereinafter; the terms "nickel oxide" or "nickel suboxide" will be used interchangeably in this specification. Such a film is insulative at cryogenic temperatures, has excellent adhesion to nickel which in turn has excellent adhesion to copper and does not chip or spall when the strand is bent over a radius subjecting it to a strain of the order of 2% or less and thus the wire can be formed (e.g. wound into a magnet coil) after the insulation is applied (provided, of course, the superconductor or superconductor precursors are formable, such as niobium-titanium, or unreacted niobium and tin). Also, the nickel oxide is stable in an inert atmosphere at 700° C. and does not degrade the electrical properties of the nickel and copper to which it is attached when subjected to 700° C. for at least 30 hours. Also, as noted, NiO films and suboxide films are insulative, but films having excess oxygen are semiconductive. By using generally substoichiometric oxygen, semiconductive portions due to process variations are avoided.

The process consists of two connected subsystems which will be described separately.

Nickel powder is converted into nickel carbonyl, $Ni(CO)_4$, by direct reaction. Nickel (which forms the only tetracoordinated, mononuclear carbonyl known) and iron are the only two metals known to react directly with carbon monoxide at moderate temperature and pressure, in high yield. However, oxygen is known to inhibit this reaction. Consequently: low oxygen (essentially oxygen-free) carbon monoxide must be used as gas feed; oxygen adsorbed on the nickel powder surface should be removed. In addition, since powder nickel is an extremely surface-active material, the oxygen is removed from the nickel powder (prior to carbonyl formation) by elevated temperature desorption using low oxygen carbon monoxide as a scavenger in an inert sweep gas. The desorption process reaction conditions generally resemble those used in the carbonyl formation reaction except that the carbon monoxide concentration is greatly diluted in the desorption gas. The desorption conditions are: temperature about 50°-700° C.; with the sweep gas having inert component of argon or nitrogen and a CO concentration of less than 1 mole percent.

A fluid bed reactor is the preferred desorption reactor geometry to provide maximum particle-fluid contact, good thermal control, and minimal particle sintering. The fluid bed configuration will support the required remote handling and will interface smoothly with the pneumatic transport system for solids handling.

The low oxygen nickel powder can be charged to the carbonyl preparation reactor by pneumatic transport using the same desorption mixture (CO + argon or nitrogen) as carrier gas the following equation describes the carbonyl formation reaction:

$$Ni + 4CO \rightarrow Ni(CO)_4$$

Due to the flammable, explosive, and toxic nature of both reagents and products, this reaction is best performed in a high pressure, high temperature autoclave even though the reaction conditions are at about 60° C. and atmospheric pressure. After reaction, the mixture is cooled to about 10°-43° C. (preferably 25° C.-40° C.); the residual carbon monoxide flared; and the nickel carbonyl liquor decanted away. The residual nickel solids can be recycled to the carbonyl reactor. The carbonyl product can be distilled to the desired purity and transferred to short term storage in a glass lined tank.

The other portion of the process is the carbonyl decomposition subsystem. The nickel suboxide is deposited on the superconductor by chemical vapor deposition, in (or followed by) an oxidizing atmosphere. The superconductor is generally heated as the substrate for the carbonyl decomposition reaction; nickel carbonyl can be charged to reactor remotely while (at least periodically) maintaining an oxidizing atmosphere. For metallic superconductors, such as niobium-titanium alloys and other refractories, this oxidizing atmosphere presents little problem, and an acceptable substoichiometric insulation should be obtained from the deposition directly. However, for oxygen-sensitive, ceramic superconductors, this oxidizing atmosphere may alter the superconductor's stoichiometry (note, however, that superconductors are normally clad with a normal conducting metal, such as copper, and also that both the ceramic superconductors and the nickel oxide insulator are substoichiometric, and thus exceptionally compatible). Hence both the nickel oxide's stoichiometry and the superconducting ceramic's stoichiometry may be adjusted during the annealing stage. Here the annealing temperature (e.g. about 900°–960° C.), the temperature range rates, and the atmosphere must be controlled carefully to produce the final product stoichiometries.

This process can control the thickness and stoichiometry of nickel suboxide insulations for superconducting applications. The process coats both ceramic and metallic superconductors (including niobium-tin and niobium titanium) and the operation can be controlled to either prevent or drive the reaction annealing of niobium and tin, for example. The insulation system is one that withstands the high reaction temperature and that can be applied at 250°–500° C. before the Nb$_3$Sn is formed (it should be noted that the reaction is driven thermally by the wire temperature and thermodynamically by decomposition/oxidation of the carbonyl, rather than only thermally by temperature as in the case of the normal reduction of carbonyl to metal, and thus the coating may be applied at a lower temperature). It may also be oxidized while heating to induce the reaction so that both the insulation and the Nb$_3$Sn may be formed in the same furnace at 500°–750° C. after the wire is formed into its final shape (for example, wound into a magnet). Purified nickel carbonyl and oxygen may be alternately introduced, to deposit a series of metallic nickel films on said wire with said wire at 140°–750° C., with each of which metallic films then being oxidized (when the oxygen is introduced) to a nickel suboxide. As the deposition of the metallic film is in the presence of little or no oxygen in such cases, a somewhat higher temperature (i.e. above about 140° C.) is generally required to drive the reaction.

An annealing stage may be required to adjust the final insulation stoichiometry. Under a controlled oxidizing or reducing atmosphere, the coated part is annealed at temperatures generally less than 1000° C. Whether the annealing atmosphere oxidizing or reducing is determined by the oxidation state of the final insulation relative to the target suboxide stoichiometry. Both firing and cooling ramp rates are generally controlled during the annealing stage.

The nickel oxide layer formed is generally a suboxide containing oxygen vacancies. It will serve as an insulator at the cryogenic operating temperature of Nb$_3$Sn. It should be noted that cuprous sulfide is a semiconductor which has been patented for use on superconductors, (see the aforementioned U.S. Pat. No. 4,330,347 of C. Hirayama and G. R. Wagner.) However, cuprous sulfide breaks down at approximately 0.5 volts while the nickel oxide will provide a higher voltage stand-off, in the range 50 to 100 volts. A further advantage of the nickel oxide as an insulation system over conventional organics or inorganics is that it provides better thermal contact between the superconductor and its coolant. Good thermal contact is required to stabilize the superconductor during magnetic and electrical disturbances. The thinness of the oxide layer provides a low thermal barrier for heat transfer from the superconductor to its surroundings.

The results obtained are not dependent upon the matrix of the superconductor wire. In practice, this matrix may be any copper-rich alloy such as Cu-Ni or CuSn. As stated above, there is a temperature limit to prevent damage to the superconductor material. It should be noted that a thickness of less than about 1.5 micron may not provide a sufficiently resistive layer. Note also that thicknesses of nickel oxide above about 20 micron tend to spall from the surface upon severe bending of the wire and thus for such thicker coatings should be done after any such bending.

In addition there are uses of nickel oxide coatings for applications other than for superconducting cables, and components thereof. For instance, it could be applied to the recently developed "hyperconductors" which are normal conductors with very high electrical conductivity at low temperatures. As used herein, the term "superconductor", includes hyperconductors.

The foregoing description of a preferred embodiment of the invention, i.e., as applied to superconductor wires, has been presented for purposes of illustration and description and is not intended to be exhaustive or to limit the invention to the precise form disclosed. It was chosen and described in order to best explain the principles of the invention and their practical application to thereby enable others skilled in the art to best utilize the invention in various embodiments as are suited to the particular use contemplated. It is intended that the scope of the invention be defined by the claims appended hereto.

We claim:

1. A process for use in fabrication of nickel suboxide insulation on a superconductor; said process comprising:
    a. reacting essentially oxygen-free nickel powder with essentially oxygen-free carbon monoxide at a temperature of at least 50° C. to produce a nickel carbonyl;
    b. separating said nickel carbonyl from reaction by-products and excess reagents by cooling said carbonyl to 10°–43° C. and decanting the nickel carbonyl liquor to produce a purified carbonyl; and
    c. at least periodically contacting said purified carbonyl to a surface of a wire containing superconductor or superconductor precursors in an atmosphere at least periodically containing a controlled amount of oxygen, with said wire being at a temperature of 50°–800° C., to produce nickel suboxide insulation on said wire.

2. The process of claim 1, wherein said superconductor is a niobium-tin superconductor, and said carbonyl is contacted to the surface of a wire containing unreacted niobium and tin with said wire at a temperature between 50°–500° C. to coat said wire with said nickel suboxide, and said wire is final formed after said coating of wire and said niobium and said tin are reaction annealed after said final forming of said wire.

3. The process of claim 1, wherein after a wire containing unreacted niobium and tin is formed into final form, said purified carbonyl is contacted to said wire with said wire at a temperature of 500°–750° C. and said niobium and said tin are reaction annealed, whereby thick coatings can be utilized and the producing of said insulation and the reaction annealing can be done essentially at the same time in the same furnace.

4. The process of claim 1, wherein said superconductor is an oxide ceramic superconductor and said contacting said purified carbonyl to a surface of said wire is with said wire at 50°–650° C.

5. The process of claim 1 wherein said reacting essentially oxygen-free nickel powder with essentially oxygen-free carbon monoxide to produce a nickel carbonyl is with said wire at 60°–70° C.

6. The process of claim 1, wherein said wire is resistance heated to a temperature at least 50° C. higher than said atmosphere.

7. The method of claim 1, wherein purified nickel carbonyl and oxygen are alternately introduced, to deposit a series of metallic nickel films on said wire with said wire at 500°–750° C., each of which metallic films are then oxidized to a nickel suboxide.

8. The method of claim 1, wherein said separating said nickel carbonyl from reaction by-products and excess reagents is performed at 25°–40° C.

* * * * *